United States Patent
Wu et al.

(10) Patent No.: US 10,263,621 B2
(45) Date of Patent: Apr. 16, 2019

(54) LEVEL SHIFTER WITH IMPROVED VOLTAGE DIFFERENCE

(71) Applicant: Taiwan Semiconductor Manufacturing Company Limited, Hsinchu (TW)

(72) Inventors: Shang-Chi Wu, Hsinchu (TW); Chiting Cheng, Taichung (TW); Wei-jer Hsieh, Hsinchu (TW); Yangsyu Lin, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/468,296

(22) Filed: Mar. 24, 2017

(65) Prior Publication Data
US 2018/0278252 A1    Sep. 27, 2018

(51) Int. Cl.
*H03L 5/00*      (2006.01)
*H03K 19/00*     (2006.01)
*H03K 19/0185*   (2006.01)

(52) U.S. Cl.
CPC ............................ *H03K 19/018521* (2013.01)

(58) Field of Classification Search
CPC .............................................. H03K 19/018521
See application file for complete search history.

(56) References Cited

U.S. PATENT DOCUMENTS

| | | | |
|---|---|---|---|
| 5,136,190 A | 8/1992 | Chern et al. | |
| 7,999,574 B2* | 8/2011 | Takenaka | H03K 3/35613 326/68 |
| 8,901,964 B2* | 12/2014 | Luo | H03K 19/0013 326/112 |
| 9,225,333 B2* | 12/2015 | Purushothaman | H03K 19/018521 |
| 2010/0188131 A1 | 7/2010 | Zhang et al. | |
| 2017/0085265 A1 | 5/2017 | Roham et al. | |

FOREIGN PATENT DOCUMENTS

| | | |
|---|---|---|
| JP | 2006270132 | 10/2006 |
| JP | 5361685 | 6/2011 |
| JP | 2013012797 | 1/2013 |
| KR | 19990071743 | 9/1999 |

(Continued)

OTHER PUBLICATIONS

Korean Office Action; Application No. 10-2017-0075844; dated Jan. 2, 2018.

(Continued)

*Primary Examiner* — Kenneth B Wells
(74) *Attorney, Agent, or Firm* — Jones Day

(57) ABSTRACT

A level shifter that comprises an input operating in an input voltage domain and an output for outputting an output signal in an output voltage domain. The level shifter further includes an inverter circuit operating in the input voltage domain for inverting an input signal to create an inverted input signal. The level shifter also includes an intermediate circuit operating in an intermediate voltage domain for generating an intermediate signal. An output buffer circuit generates the output signal based at least in part on the inverted input signal and the intermediate signal.

20 Claims, 6 Drawing Sheets

(56) References Cited

FOREIGN PATENT DOCUMENTS

KR            101174846         2/2009

OTHER PUBLICATIONS

German Office Action; Application No. 102017110448.8; dated Feb. 26, 2018.
Taiwan Office Action; Application No. 106132832; dated Oct. 24, 2018.
Korean Notice of Allowance; Application No. 10-2017-0075844; dated Jul. 20, 2018.

\* cited by examiner

US 10,263,621 B2

LEVEL SHIFTER WITH IMPROVED VOLTAGE DIFFERENCE

TECHNICAL FIELD

This relates to semiconductor devices and more particularly to level shifter semiconductor devices capable of achieving increased voltage differences between an input voltage domain and an output voltage domain.

BACKGROUND

A level shifter is a semiconductor device capable of receiving a digital input signal in a first voltage domain and outputting a corresponding digital signal in a second voltage domain. The second voltage domain may be higher or lower than the first voltage domain. Typically, such a level shifter is utilized in circuits between portions of the circuit that have different voltage requirements. In this manner, the portions of the circuit capable of operating in a lower voltage domain operate at the lower voltage domain, and portions of the circuit required to operate at a higher voltage domain can operate within the higher voltage domain. The level shifter interfaces with both portions of the circuit so they can communicate with one another.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
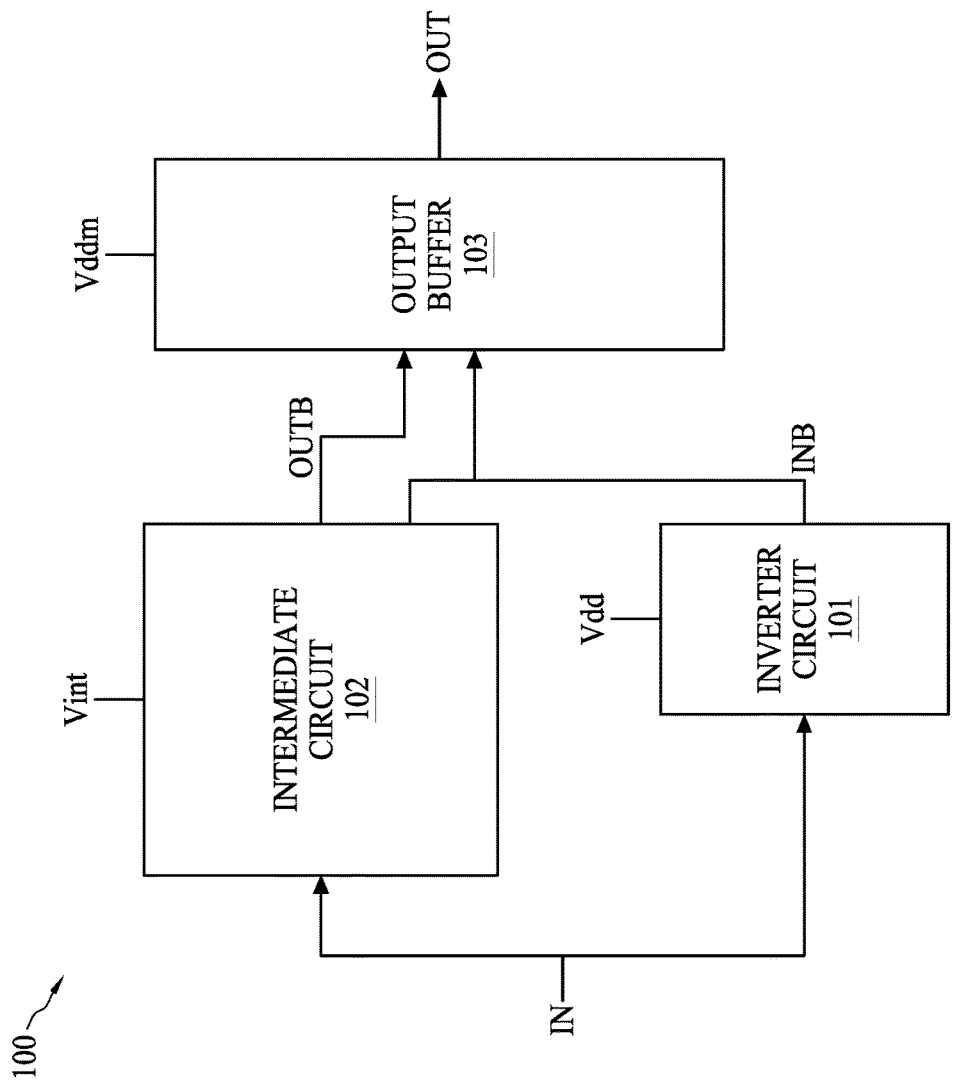
FIG. 1 is a block diagram of an example of a level shifter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A level shifter is a semiconductor device capable of receiving a digital input signal in a first voltage domain and outputting a corresponding digital signal in a second voltage domain. The second voltage domain may be higher or lower than the first voltage domain. Such a level shifter is utilized in circuits between portions of the circuit that have different voltage requirements, using a configuration of transistors to perform desired shifting. In this manner, the portions of the circuit capable of operating in a lower voltage domain are permitted to operate at the lower voltage domain and portions of the circuit required to operate at a higher voltage domain can operate within the higher voltage domain. The level shifter interfaces with both portions of the circuit so they can communicate with one another. When acting as an interface, a level shifter may be referred to as shifting from an input voltage domain (e.g., a voltage domain operating from a V to b V) to an output voltage domain (e.g., a voltage domain operating from x V to y V).

Level shifters are susceptible to a number of limitations. For example, a magnitude of the difference between the input voltage domain and the output voltage domain (e.g., the difference between a-to-x and b-to-y) is typically limited to particular ranges because of various limitations of the level shifter transistors and their characteristics. Additionally, there is a delay associated with level shifter devices because of the number of transistors an input signal is switched through before reaching the output. For example, a typical delay associated with a level shifter may be a three (3) gate delay. Further, some embodiments of level shifters suffer from leakage current during operation which increases the power consumption of the level shifter.

Level shifter devices described herein may be implemented using various types of semiconductor devices (e.g., MOSFETs, CMOS, etc.) that, in some embodiments, achieve various combinations of one of more of an increased voltage difference between an input voltage domain and an output voltage domain, increased speed of the level shifting operation, and reduced leakage current. In some embodiments, one or more of these benefits may be achieved by using an intermediate circuit operating in an intermediate voltage domain between the lower voltage domain and the higher voltage domain, as described in more detail below.

FIG. 1 is a block diagram of an example of a level shifter in accordance with some embodiments. As illustrated in FIG. 1, a level shifter 100 includes an input (IN) and an output (OUT). Input signals are in an input voltage domain (Vdd) and output signals are in an output voltage domain (Vddm). As discussed previously, the input voltage domain (Vdd) may be higher or lower than the output voltage domain (Vddm). In the embodiment of FIG. 1, the output voltage domain (Vddm) is higher than the input voltage domain (Vdd).

As described herein, the input signal at IN and output signal at OUT are digital signals. Accordingly, the signals have a logical low value (e.g., 0 Volts) and a logical high value (e.g., 3 Volts). In the input voltage domain (Vdd) the logical high voltage may be Vdd Volts. In the output voltage domain (Vddm) the logical high voltage may be Vddm Volts.

The level shifter 100 illustrated in FIG. 1 includes an inverter circuit 101 operating in an input voltage domain (Vdd) for inverting an input signal to create an inverted input signal INB. The level shifter 100 also includes intermediate circuit 102 for receiving the input signal IN and generating an intermediate signal OUTB in an intermediate voltage domain (Vint). The output INB of the inverter circuit 101 is also an input to the intermediate circuit 102. The intermediate signal OUTB and an inverted input signal INB are input to an output buffer circuit 103 for generating an output signal OUT in an output voltage domain based at least in part on the inverted input signal INB and the intermediate signal OUTB. As illustrated, the inverter circuit 101 may be operated by an input domain voltage (Vdd) and the output buffer circuit 103 may be operated by the output domain voltage (Vddm). The intermediate circuit 102 may be operated by an intermediate voltage Vint that is between the input domain voltage (Vdd) and the output domain voltage (Vddm). In embodiments, the intermediate voltage may be slightly (e.g., closer to Vddm than to Vdd) less than the output voltage (Vddm). In some embodiments, the intermediate voltage (Vint) may be created by applying a voltage drop to the output voltage (Vddm).

Figure 2:
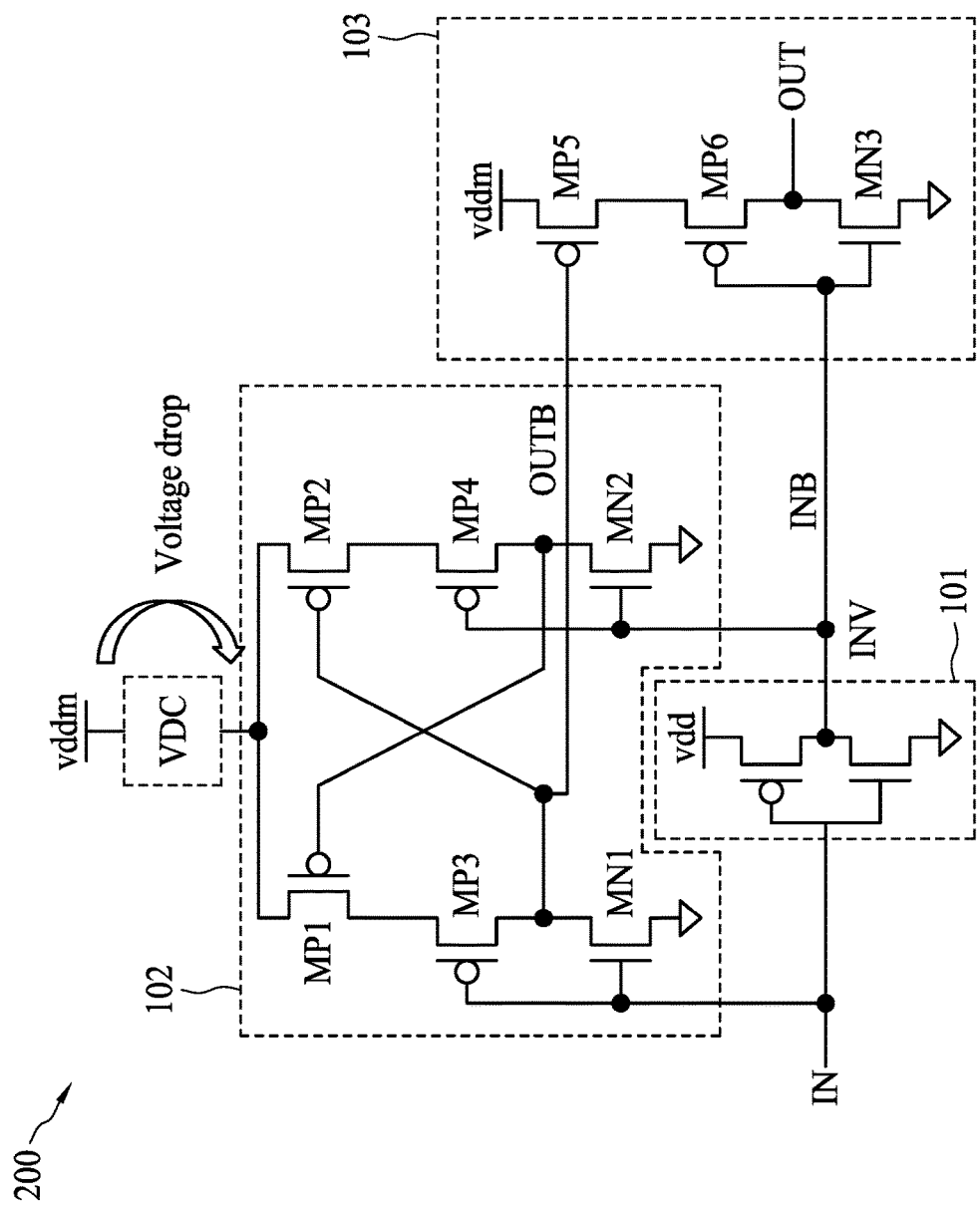
FIG. 2 is a schematic diagram of a first example of a level shifter in accordance with some embodiments.

FIG. 2 is a schematic diagram of a first example of a level shifter in accordance with some embodiments. As illustrated in FIG. 2, a level shifter 200 includes an input (IN) and an output (OUT). The level shifter 200 may be a circuit diagram corresponding to the block diagram of the level shifter 100 in FIG. 1. Input signals are in an input voltage domain (Vdd) and output signals are in an output voltage domain (Vddm). As discussed previously, the input voltage domain (Vdd) may be higher or lower than the output voltage domain (Vddm). In the embodiment of FIG. 2, the output voltage domain (Vddm) is higher than the input voltage domain (Vdd).

As described herein, the input signal at IN and output signal at OUT are digital signals. Accordingly, the signals have a logical low value (e.g., 0 Volts) and a logical high value (e.g., 3 Volts). In the input voltage domain (Vdd) the logical high voltage may be Vdd Volts. In the output voltage domain (Vddm) the logical high voltage may be Vddm Volts.

As illustrated in FIG. 2, the level shifter 100 is implemented using complementary metal oxide semiconductor (CMOS) technology (e.g., NMOS and PMOS transistors). In operation, CMOS transistors operate like switches—in an ON state, the switch is closed and in an OFF state the switch is open. For NMOS transistors (e.g., MN1, MN2, MN3), when a voltage exceeding a threshold voltage (Vth) of the NMOS transistor is applied to the gate, the NMOS transistor turns ON and current passes between a source and a drain, otherwise, the NMOS transistor is OFF and current is prevented from passing between the source and the drain. In the case of a PMOS transistor (e.g., MP1, MP2, MP3, MP4, MP5, MP6), when a voltage exceeding the threshold voltage (Vth) of the PMOS transistor is applied to the gate, the PMOS transistor is OFF and current is prevented from passing between the source and the drain, otherwise, the PMOS transistor is ON and current passes between the source and the drain.

The level shifter 200 includes an inverter INV 101 operating in the Vdd voltage domain. The level shifter 200 also includes an intermediate circuit 102 that in turn includes two pull-low NMOS transistors (MN1, MN2), two cross-coupling PMOS transistors (MP1, MP2), and stacking PMOS transistors (MP3, MP4) between the pull-low NMOS transistors (MN1, MN2) and the cross coupling PMOS transistors (MP1, MP2). Transistors MP1, MP2, MP3, MP4, MN1, and MN2 operate in an intermediate voltage domain between Vdd and Vddm. In some embodiments, these transistors may make up an intermediate circuit 102 such as the one described in FIG. 1. As illustrated, a voltage Vddm is applied to a voltage drop circuit VDC configured to drop the voltage applied to MP1 and MP2 to a voltage that is less than Vddm. In some embodiments, the voltage drop may be less than a threshold voltage of one or more of the transistors illustrated in level shifter 200 (e.g., less than or equal to the threshold voltage of MP5). The level shifter 200 further comprises an output buffer circuit 103 including two stacking PMOS transistors (MP5, MP6) and an NMOS transistor (MN3). The output buffer circuit 103 operates in a Vddm voltage domain.

In FIG. 2, intermediate signal OUTB is coupled to the gate of MP5 and intermediate signal INB is coupled to the input of MP6 and MN3. In some embodiments, the threshold voltage of MP5 may be larger than the voltage drop generated by the voltage drop circuit VDC. As discussed in more detail below, the voltage drop circuit VDC can be implemented in numerous ways (e.g., a regulator, a PMOS device configured as a diode, or an NMOS device configured as a diode).

In operation, an input signal at IN is sent to inverter INV 101 and to MN1 and MP3. If the input signal at IN is a logical low value (e.g., 0 Volts), the output of inverter INV 101 is a logical high value (e.g., Vdd Volts), MN1 remains OFF and MP3 is turned ON. The output of inverter INV 101 causes NMOS transistor MN2 to turn ON and as a result, a logical low voltage is applied to MP1 and MP1 is turned ON. Since MP1 and MP3 are both ON, the voltage at OUTB is the intermediate voltage Vddm less the voltage drop caused by the voltage drop circuit. A logical high value for OUTB causes MP5 to turn OFF and a logical high value for INB causes MP6 to remain OFF while MN3 turns ON. As a result, the voltage at the output OUT is the same as the voltage at the input IN e.g., 0 Volts.

If the input signal at the input IN is a logical high value (e.g., Vdd Volts), the output of inverter INV 101 is a logical low value (e.g., 0 Volts), MN1 turns ON and MP3 is turned OFF. As a result, the intermediate signals OUTB and INB are both a logical low value (e.g., 0 Volts). This causes MP5 and MP6 to turn ON while MN3 turns OFF. As a result, the voltage at the output OUT is a logical high value—e.g., Vddm Volts.

In some embodiments, to reduce leakage current, the threshold voltage (Vth) of MP5 may be selected to be greater than the voltage drop of the voltage drop circuit VDC. As a result, the intermediate voltage (Vddm less the voltage drop) when OUTB is a logical high value is capable of fully turning OFF MP5 because the intermediate voltage remains larger than the threshold voltage (Vth) of MP5.

In some embodiments, the threshold voltage of MP1, MP2, MP3, and MP4 may be the same as or lower than the threshold voltage of MN1 and MN2. In some embodiments, it may be desirable to increase the threshold voltage of MN1 and MN2 as much as possible. In particular, this configuration keeps MN1 and MN2 OFF for a longer amount of time when transitioning to a logical high value and allows MN1 and MN2 to turn OFF sooner when transitioning to a logical low value. By delaying these transitions of MN1 and MN2 to an ON state, the level shifter benefits from a reduced leakage current because there is less time during the transitions when current is flowing through MN1 and MN2 to the ground.

In some embodiments, the transistor MP6 may be utilized to prevent a DC current between Vddm and ground. For example, the INB signal transitions to a logical high value sooner than the OUTB signal transitions to a logical high value when the input signal at IN transitions from a logical high value to a logical low value. Further, when the input signal IN transitions from a logical high to a logical low value, signal INB transitions to a logical high value. This turns MP6 OFF, preventing current flow from Vddm to ground even if MP5 may still be ON. As can be understood from the discussion above, the operation of the level shifter 200 differs depending on the value of the input signal (IN). When the input signal goes from a logical high value to a logical low value, the gate delay for INB is a one (1) gate delay attributed to the inverter (INV 101). That is, when the input signal at IN voltage decreases to below the threshold voltage (Vth) of the transistors in the inverter circuit INV 101, signal INB goes to a logical high value (e.g., Vdd Volts) and the delay in this transition is only one (1) gate delay. When the input signal goes from a logical high value to a logical low value, the gate delay for OUTB is a three (3) gate delay attributed to the inverter INV 101, MN2, and MP1. That is, when the input signal voltage decreases to below the threshold voltage (Vth) of the transistors in the inverter circuit INV 101, signal INB goes to a logical high value (e.g., Vdd Volts), MN2 turns ON and pulls the drain of MN2 (or the gate of MP1) to a logical low value (ground) at the source of MN2, which turns MP1 ON. Because MP3 and MP1 are ON, OUTB transitions to a logical high value at the source of MP1 (i.e., the source voltage of MP1 is equal to the intermediate voltage). This results in a total of a three (3) gate delay of INV 101, MN2, and MP1. As a result, MP5 does not turn OFF until after three (3) gate delays and MP6 separates the voltage Vddm from the ground at the source of MN3.

As described above, the gate delay attributed to the level shifter 200 when the input signal (IN) transitions from a high to a low value is a three (3) gate delay. However, when the input signal (IN) transitions from a low to a high value the gate delay is a two (2) gate delay—the transistor MN1 turns ON so that OUTB is pulled to a logical low value (ground) at the source of MN1. Then the output buffer 103 switches the output value at OUT to a logical high value (Vddm) at the source of MP5. Accordingly, in some embodiments, the aggregate gate delay for the level shifter 200 may be less than a three (3) gate delay (e.g., a 2.5 gate delay equal to the average of 3 gate delay and 2 gate delays).

In exemplary embodiments, the level shifter 200 may operate in various Vdd/Vddm ranges. For example, in some embodiments, Vdd may be between 0.33 and 1.115 Volts and Vddm may be between 0.6 and 1.15 volts. In embodiments, the Vdd and Vddm may be any of various combinations of these Vdd and Vddm values including, for example, a Vdd of less than 0.5 Volts and a Vddm of greater than 0.9 Volts.

Figure 3:
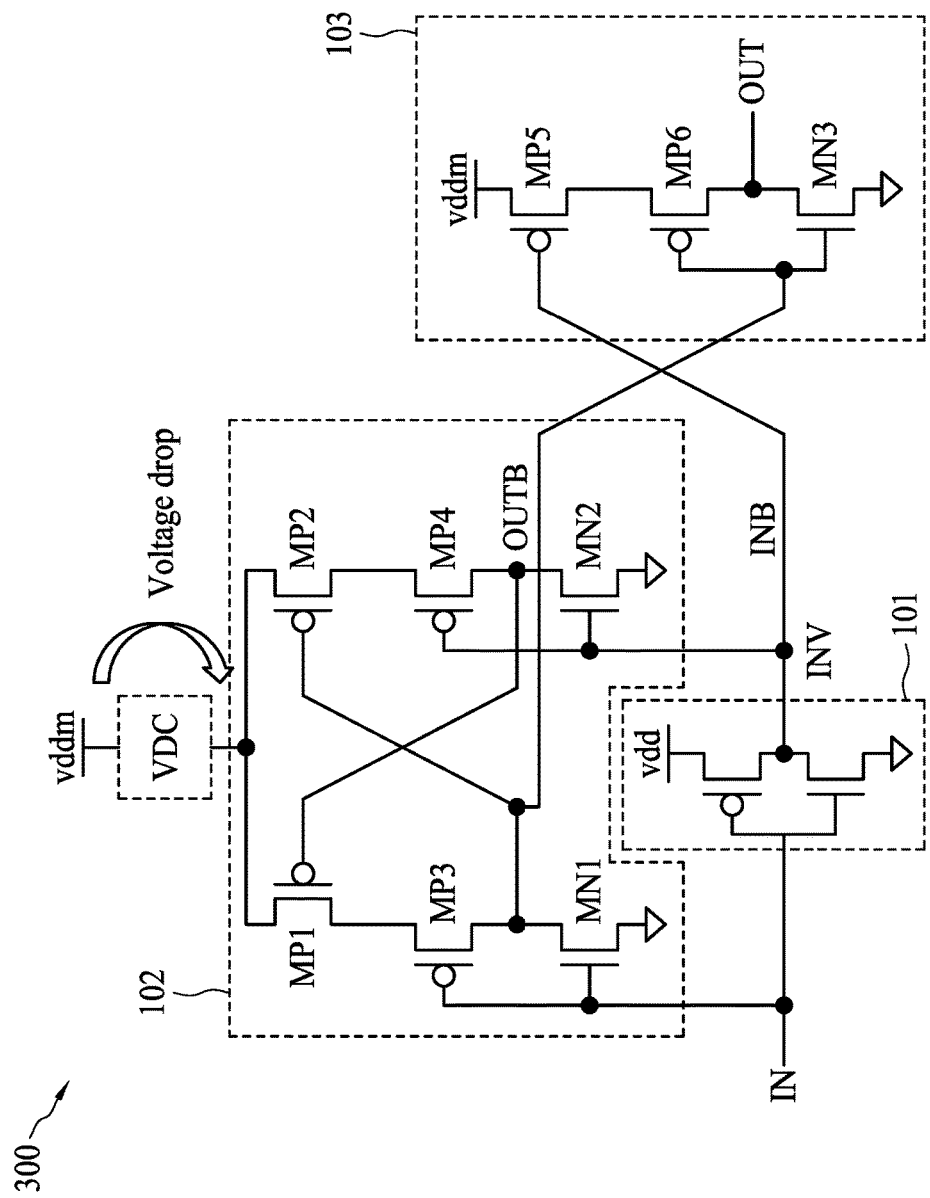
FIG. 3 is a schematic diagram of a second example of a level shifter in accordance with some embodiments.

FIG. 3 is a schematic diagram of a second example of a level shifter in accordance with some embodiments. The level shifter 300 in FIG. 3 is substantially similar to the level shifter 200 in FIG. 2 except the OUTB signal is connected to MP6 and MN3 (instead of MP5) and the INB signal is connected to MP5 (instead of MP6 and MN3). In operation, the level shifter 300 operates in a manner similar to that described above except that the operation of the output buffer 103 is reversed. Accordingly, when OUTB is a logical low value, MP6 is ON, MN3 is OFF and when OUTB is a logical high value, MP6 is OFF and MN3 is ON. When INB is a logical low value, MP5 is ON and when INB is a logical high value, MP5 is OFF. Overall, the level shifter circuit 300 functions the same as the level shifter circuit 200 described with respect to FIG. 2.

Figure 4:
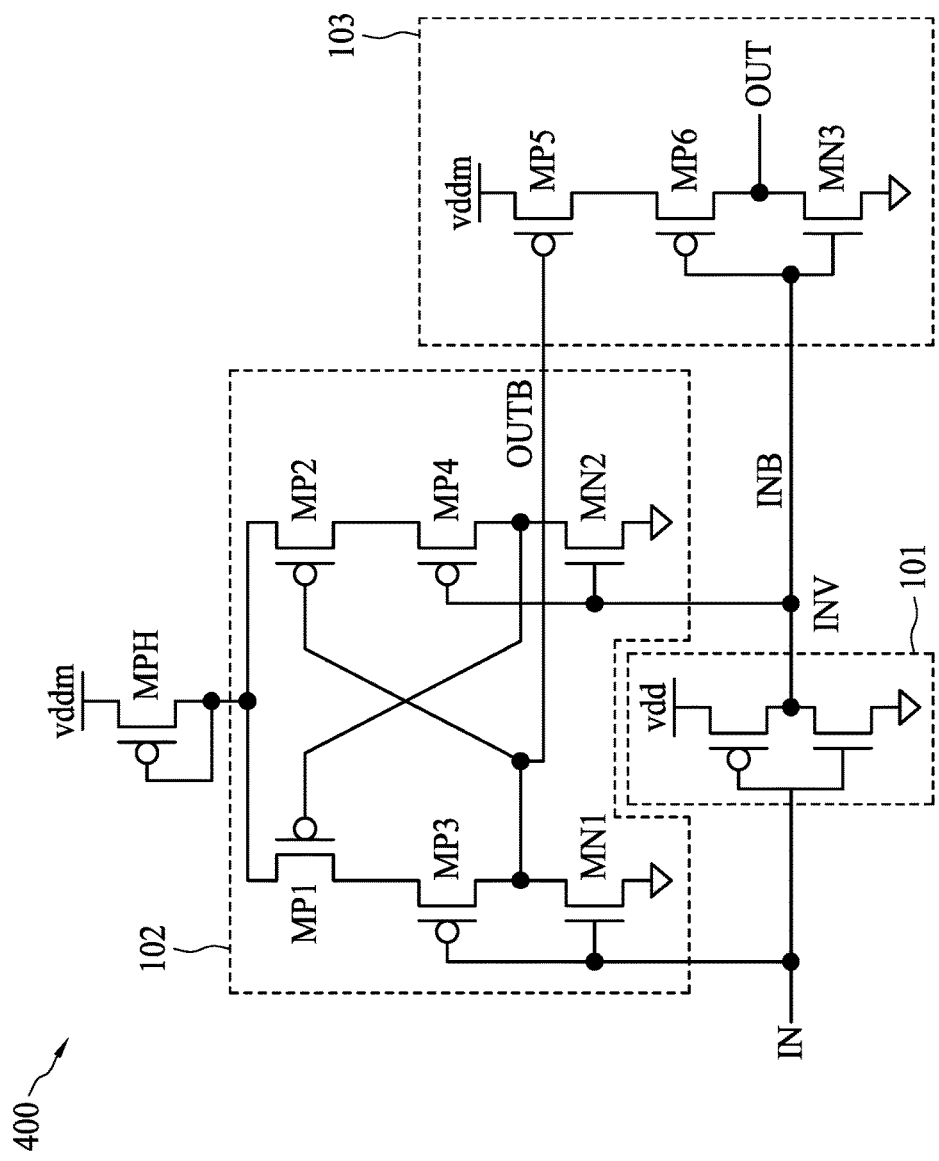
FIG. 4 is a schematic diagram of a third example of a level shifter in accordance with some embodiments.

FIG. 4 is a schematic diagram of a third example of a level shifter in accordance with some embodiments. The level shifter 400 in FIG. 4 is substantially similar to the level shifter 200 in FIG. 2 except the voltage drop circuit VDC is replaced with a PMOS transistor MPH. As illustrated, the gate of the PMOS transistor is coupled to the drain of the transistor to create a two connection diode. This configuration of MPH causes a voltage drop across MPH substantially equal to the threshold voltage (Vth) of MPH. Accordingly, the intermediate voltage in level shifter 400 is Vddm minus Vth of MPH. In some embodiments, the threshold voltage (Vth) of MPH is less than the threshold voltage of MP5.

Figure 5:
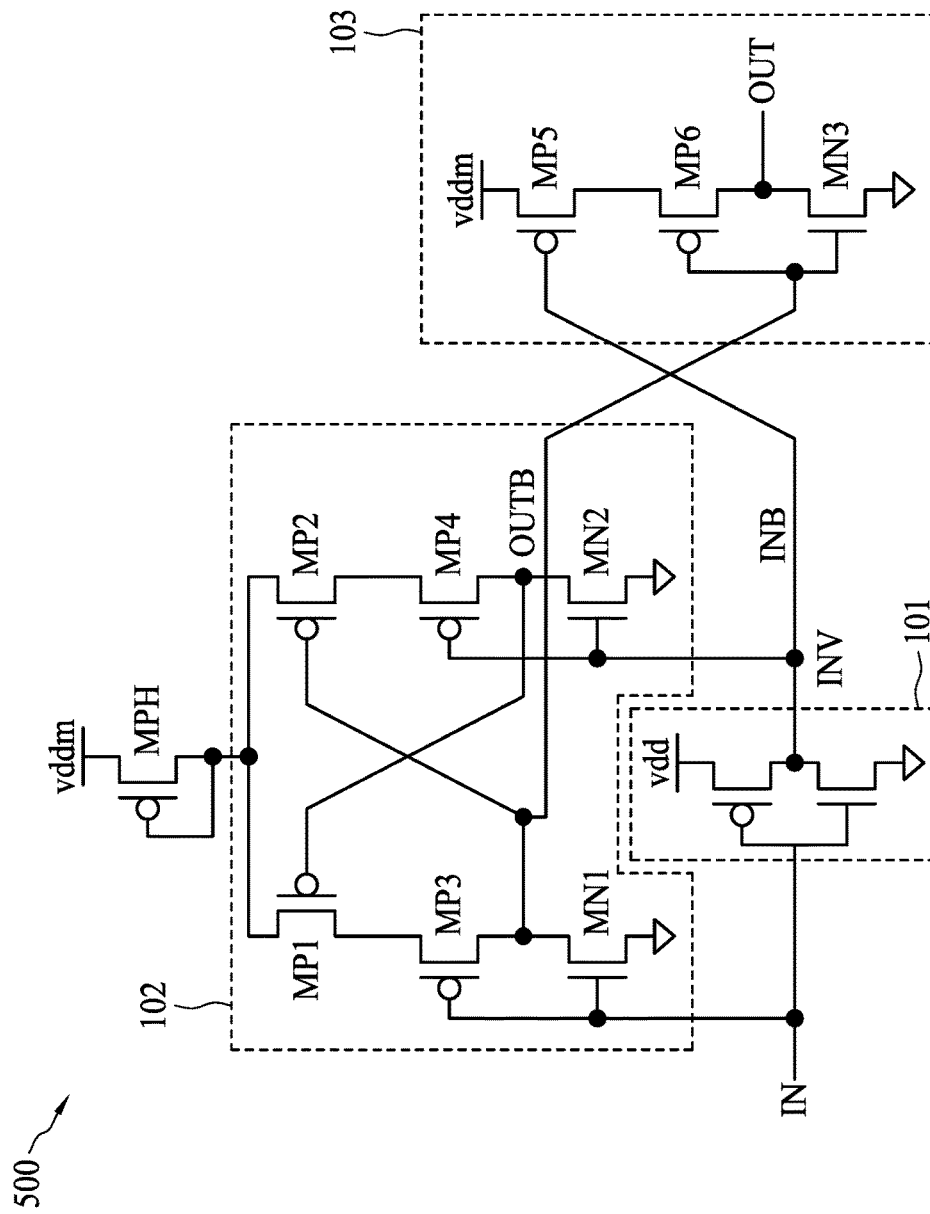
FIG. 5 is a schematic diagram of a fourth example of a level shifter in accordance with some embodiments.

FIG. 5 is a schematic diagram of a fourth example of a level shifter in accordance with some embodiments. The level shifter 500 in FIG. 5 is substantially similar to the level shifter 400 in FIG. 4 except the OUTB signal is connected to MP6 and MN3 (instead of MP5) and the INB signal is connected to MP5 (instead of MP6 and MN3) as in the embodiment illustrated in FIG. 3. Accordingly, similar to the operation in FIG. 3, in operation, the level shifter 500 operates in a manner similar to that described above except that the operation of the output buffer 103 is reversed. Accordingly, when OUTB is a logical low value, MP6 is ON, MN3 is OFF and when OUTB is a logical high value, MP6 is OFF and MN3 is ON. When INB is a logical low value, MP5 is ON and when INB is a logical high value, MP5 is OFF.

Figure 6:
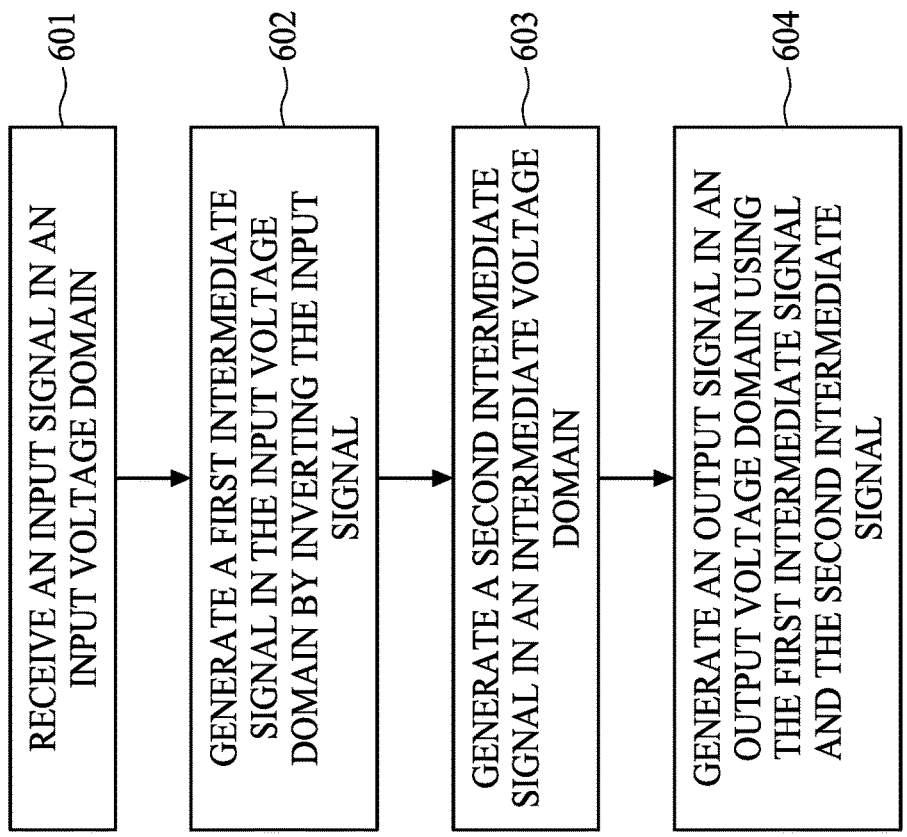
FIG. 6 is a flow chart illustrating the operation of a level shifter in accordance with some embodiments.

FIG. 6 is a flow chart illustrating the operation of a level shifter in accordance with some embodiments. In operation 601, the level shifter 100 receives an input signal at an input IN. The input voltage signal is in an input voltage domain (e.g., Vdd). In operation 602, the level shifter 100 generates a first intermediate signal INB in the input voltage domain (e.g., Vdd) by inverting the input signal. In some embodiments, an inverter (101, INV) may be utilized to invert the input signal and output INB. In operation 603, the level shifter 100 generates a second intermediate signal OUTB in an intermediate voltage domain (e.g., Vddm minus a voltage drop). In some embodiments, the portion of the level shifter 100 for generating the second intermediate signal may include an intermediate circuit 102 comprising two pull-low NMOS transistors (MN1, MN2), two cross-coupling PMOS transistors (MP1, MP2), and stacking PMOS transistors (MP3, MP4) between the pull-low NMOS transistors (MN1, MN2) and the cross coupling PMOS transistors (MP1, MP2). Transistors MP1, MP2, MP3, MP4, MN1, and MN2 operate in the intermediate voltage domain (Vint). In operation 604, the level shifter 100 generates an output signal at OUT in an output voltage domain (e.g., Vddm) using the first intermediate signal INB and the second intermediate signal OUTB. In some embodiments, the portion of the level shifter 100 for generating the output signal may be an output buffer circuit 103 comprising two stacking PMOS transistors (MP5, MP6) and an NMOS transistor MN3. The buffer circuit 103 operates in a Vddm voltage domain.

Some embodiments described herein may include a level shifter that comprises an input operating in an input voltage domain and an output for outputting an output signal in an output voltage domain. The level shifter further includes an inverter circuit operating in the input voltage domain for inverting an input signal to create an inverted input signal. The level shifter also includes an intermediate circuit operating in an intermediate voltage domain for generating an intermediate signal. An output buffer circuit generates the output signal based at least in part on the inverted input signal and the intermediate signal.

Some embodiments described herein may include a level shifter that includes an inverter circuit, an intermediate circuit and an output buffer circuit. The inverter circuit operates in an input voltage domain for inverting an input signal to create an inverted input signal. The intermediate circuit receives the input signal and generates an intermediate signal in an intermediate voltage domain. The intermediate circuit comprises two pull-low NMOS transistors, two cross-coupling PMOS transistors, and stacking PMOS transistors between the pull-low NMOS transistors and the cross coupling PMOS transistors. The level shifter also includes an output buffer circuit for generating an output signal in an output voltage domain based at least in part on the inverted input signal and the intermediate signal. The output buffer signal comprises at least two inputs, two stacking PMOS transistors, and an NMOS transistor.

Some embodiments described herein may include a method for operating a level shifter comprising receiving an input signal in an input voltage domain and generating a first intermediate signal in the input voltage domain by inverting the input signal. The method further includes generating a second intermediate signal in an intermediate voltage domain and generating an output signal in an output voltage domain based at least in part on the first intermediate signal and the second intermediate signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A level shifter comprising:
   an input operating in an input voltage domain;
   an inverter circuit operating in the input voltage domain for inverting an input signal to create an inverted input signal in the input voltage domain;
   an intermediate circuit operating in an intermediate voltage domain for generating an intermediate signal in the intermediate voltage domain, wherein the input and the inverted input signals are inputs to the intermediate circuit;
   an output buffer circuit operating in an output voltage domain and exclusive of the input voltage domain for generating an output signal based at least in part on the inverted input signal and the intermediate signal, wherein the inverted input signal and the intermediate signal are inputs to the output buffer circuit; and
   an output for outputting an output signal in the output voltage domain.

2. The level shifter of claim 1, wherein the intermediate circuit comprises two pull-low NMOS transistors, two cross-coupling PMOS transistors, and stacking PMOS transistors between the two pull-low NMOS transistors and the two cross-coupling PMOS transistors.

3. The level shifter of claim 1, wherein the output buffer circuit comprises two stacking PMOS transistors and an NMOS transistor.

4. The level shifter of claim 1, wherein the output buffer circuit comprises two inputs and the intermediate signal is applied to one input and the inverted input signal is applied to the other input.

5. The level shifter of claim 1, wherein an input voltage is applied to the inverter circuit, an intermediate voltage is applied to the intermediate circuit, and an output voltage is applied to the output buffer circuit.

6. The level shifter of claim 5, wherein the input voltage is equal to, less than, or greater than the output voltage.

7. The level shifter of claim 5, wherein the intermediate voltage is less than the output voltage and more than the input voltage.

8. The level shifter of claim 5, wherein the intermediate voltage is created by applying a voltage drop to the output voltage.

9. The level shifter of claim 8, wherein the voltage drop is generated by a MOS transistor configured as a diode.

10. The level shifter of claim 1, wherein there is a two gate delay from the input to the output when the input goes from a logical low value to a logical high value.

11. The level shifter of claim 1, wherein an aggregate gate delay for the level shifter is less than a 3 gate delay.

12. A level shifter comprising:
    an inverter circuit operating in an input voltage domain for inverting an input signal to create an inverted input signal in the input voltage domain;
    an intermediate circuit for receiving the input signal and generating an intermediate signal in an intermediate voltage domain, the intermediate circuit comprising two pull-low NMOS transistors, two cross-coupling PMOS transistors, and stacking PMOS transistors between the pull-low NMOS transistors and the cross coupling PMOS transistors, wherein the input signal and the inverted input signals are inputs to the intermediate circuit; and
    an output buffer circuit operating in an output voltage domain and exclusive of the input voltage domain for generating an output signal in the output voltage domain based at least in part on the inverted input signal and the intermediate signal, the output buffer signal comprising at least two inputs, two stacking PMOS transistors, and an NMOS transistor, wherein the inverted input signal and the intermediate signal are inputs to the output buffer circuit.

13. The level shifter of claim 12, wherein the output buffer circuit comprises two inputs and the intermediate signal is applied to one input and the inverted input signal is applied to the other input.

14. The level shifter of claim 12, wherein an input voltage is applied to the inverter circuit, an intermediate voltage is applied to the intermediate circuit, and an output voltage is applied to the output buffer circuit.

15. The level shifter of claim 14, wherein the input voltage is equal to, less than, or greater than the output voltage.

16. The level shifter of claim 14, wherein the intermediate voltage is equal to, less than, or greater than the output voltage and more than the input voltage.

17. The level shifter of claim 14, wherein the intermediate voltage is created by reducing the output voltage with a voltage drop circuit.

18. The level shifter of claim 17, wherein the voltage drop is generated by a MOS transistor configured as a diode.

19. The level shifter of claim 12, wherein an aggregate gate delay for the level shifter is less than a 3 gate delay.

20. A method for operating a level shifter comprising:
    receiving an input signal in an input voltage domain;
    generating a first intermediate signal in the input voltage domain by inverting the input signal;
    generating a second intermediate signal in an intermediate voltage domain, wherein the input signal and the first intermediate signal are inputs to a circuit for generating the second intermediate signal in the intermediate voltage domain; and generating an output signal in an output voltage domain based at least in part on the first intermediate signal and the second intermediate signal, wherein the first intermediate signal and the second intermediate signal are inputs to a circuit operating in the output voltage domain and exclusive of the input voltage domain for generating the output signal in the output voltage domain.

\* \* \* \* \*